(12) United States Patent
Younis et al.

(10) Patent No.: US 6,956,923 B1
(45) Date of Patent: Oct. 18, 2005

(54) HIGH SPEED PHASE DETECTOR ARCHITECTURE

(75) Inventors: Ahmed Younis, Austin, TX (US); Shahriar Rokhsaz, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 66 days.

(21) Appl. No.: 10/421,247

(22) Filed: Apr. 22, 2003

Related U.S. Application Data

(63) Continuation-in-part of application No. 10/346,435, filed on Jan. 17, 2003.

(51) Int. Cl.[7] .............................. H03D 3/24; H03L 7/06
(52) U.S. Cl. ...................... 375/375; 375/376; 327/159
(58) Field of Search .................... 375/354, 360, 375/361, 359, 375, 373, 376, 371; 327/141, 327/144, 146, 155, 159, 150, 154, 156

(56) References Cited

U.S. PATENT DOCUMENTS

| | | | |
|---|---|---|---|
| 5,248,969 A * | 9/1993 | Lee et al. ...................... 341/73 |
| 6,034,554 A | 3/2000 | Francis et al. | |
| 6,225,831 B1 * | 5/2001 | Dalmia et al. ................. 327/12 |
| 6,356,160 B1 | 3/2002 | Robinson et al. | |
| 6,686,777 B1 * | 2/2004 | Karlquist ........................ 327/2 |
| 6,771,728 B1 * | 8/2004 | Abernathy ................... 375/371 |
| 2002/0021470 A1 | 2/2002 | Savoj | |
| 2003/0001557 A1 | 1/2003 | Pisipaty | |

OTHER PUBLICATIONS

Seedher, "Fractional Rate Phase Detectors for Clock and Data Recovery," 2003, IEEE, pp313-316.*
Savoj, "A 10-Gb/s CMOS Clock and data Recovery Circuit with Half-Rate Binary Phase/Frequency Detector,"IEEE Journal of solid state,vol. 38, No. 1, Jan. 2003, pp. 13-21.*
Jafar Savoj, Behzad Razavi; "A 10-Gb/s CMOS Clock and Data Recovery Circuit with a Half-Rate Linear Phase Detector"; IEEE 2001; IEEE Journal of Solid-State Circuits, vol. 36, No. 5; May 2001; pp. 761-767.
Charles R. Hogge; "A Self Correcting Clock Recovery Circuit"; IEEE Journal of Lightwave Technology; vol. LT-3; Dec. 1985; pp. 249-251.

* cited by examiner

*Primary Examiner*—Tesfaldet Bocure
(74) *Attorney, Agent, or Firm*—James Harrison; Timothy W. Markison

(57) ABSTRACT

A high speed phase detector circuit operating at a clock speed equal to one-half an input data rate (i.e. a half-rate clock) provides phase information and transition information from incoming serial data. The high speed phase detector circuit samples the incoming serial data on both the rising edge and falling edge of the half-rate clock to provide equivalent full high speed data rate sampling. The high speed phase detector circuit generates a delay between the phase information and the transition information. The phase information is produced in a first bit period and the transition information is produced in a second bit period relative to the first bit period.

36 Claims, 8 Drawing Sheets phase locked loop circuit 10 phase detector 14 phase detector coarse frequency control module 44 clock recovery circuit 170 phase locked loop circuit method phase locked loop circuit method (continued)

HIGH SPEED PHASE DETECTOR ARCHITECTURE

FIELD OF THE INVENTION

This invention relates generally to communication systems and more particularly to high speed phase detector circuits used therein.

DESCRIPTION OF RELATED ART

Communication systems are known to transport large amounts of data between a plurality of end user devices, which, for example, includes telephones, facsimile machines, computers, television sets, cellular telephones, personal digital assistants, etc. As is also known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or Internet. As is further known, communication systems include a plurality of system equipment to facilitate the transporting of data. Such system equipment includes, but is not limited to, routers, switches, bridges, gateways, protocol converters, frame relays, private branch exchanges, etc.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Some synchronous Optical NETwork (SONET), for example, requires 10 gigabits per second. In accordance with such standards, many system components and end user devices of a communication system transport data via serial transmission paths. As such, each system component and end user device must receive the serial data without loss of information. Accurate recovery of information from high speed serial transmissions typically requires transceiver components that operate at clock speeds equal to or higher than the received serial data rate. One method used in prior art to overcome a precise alignment problem was to insert a one-half data bit delay between phase detector control signals. Generating a consistent one-half data bit delay in high speed circuits over process, voltage, and temperature and in the presence of phase noise and clock skew is problematic.

As the demand for data throughput increases, so does the demand on a high speed serial transceiver. The increased throughput demands are pushing some current integrated circuit manufacturing processes to their operating limits, where integrated circuit processing limits (e.g., device parasitics, trace sizes, propagation delays, device sizes, etc.) and integrated circuit (IC) fabrication limits (e.g., IC layout, frequency response of the packaging, frequency response of bonding wires, etc.) limit the speed at which the high speed serial transceiver may operate without excessive jitter performance and/or noise performance. For example, phase and transition signals are required to be aligned under prior art designs to facilitate proper phase alignment. Jitter and other timing delays, however, adversely affect a system's ability to properly recover a clock in a received signal.

A further alternative for high speed serial transceivers is to use an IC technology that inherently provides for greater speeds. For instance, switching from a complimentary metal oxide semi-conductor (CMOS) process to a silicon germanium or gallium arsenide process would allow integrated circuit transceivers to operate at greater speeds, but at substantially increased manufacturing costs. Currently, for most commercial-grade applications, including communication systems, such alternate integrated circuit fabrication processes are too cost prohibitive for wide spread use.

What is needed, therefore, is an apparatus that can receive high speed serial transmissions and recover the clock and/or data by providing a repeatable, fixed delay in phase detector control signals while ensuring data integrity with cost-conscious technology.

BRIEF SUMMARY OF THE INVENTION

A high speed phase detector circuit operating at a clock speed equal to one-half an input data rate (i.e. a half-rate clock) is presented to provide phase information and transition information from incoming serial data. The high speed phase detector circuit uses a pair of latches, clocked on complimentary signals, to sample the incoming serial data on both the rising edge and falling edge of the half-rate clock to provide equivalent full high speed data rate sampling. The high speed phase detector circuit functions to maintain the half-rate clock signal transitions in a desired timing relationship to the incoming serial data (e.g., substantially near the center of the incoming data when the loop is locked). The high speed phase detector circuit produces the phase information and the transition information from combinational logic coupled to outputs of a second latch and a fourth latch. The phase information indicates how well the feedback signal is aligned with the incoming serial data and is used to adjust a phase of the half-rate clock to maintain the desired timing relationship. The transition information, indicating a change in logic levels between two successive incoming serial data bits, is used to maintain a phase lock when the incoming serial data contains a sequence of serial data bits with the same logic level.

The high speed phase detector circuit includes first and second configurations of combinational logic coupled across a second latch and fourth latch, clocked on complimentary signals, to generate a delay between the phase information and the transition information. In one described embodiment of the invention, the delay is equal to one-half bit period. In alternate embodiments of the invention, the delay may vary. For example, if master-slave configured flip flops are used in place of the second and fourth latches, the delay is approximately equal to one and one-half bit periods. Generally, therefore, the delay is a multiple of one-half bit period increments.

The phase information is produced in a first bit period and the transition information is produced in a second bit period relative to the first bit period, wherein the phase information is reliably timed for a middle of the first bit period and the transition information is reliably timed for a beginning of the second bit period. Accordingly, the phase and transition information are provided to an error signal generation module that, in turn, provides a corresponding error signal to a controlled oscillation module. The oscillation module then generates an oscillating signal that is produced to a feedback module, which, in turn, produces a feedback signal to the phase detector.

DETAILED DESCRIPTION OF THE INVENTION

Figure 1:
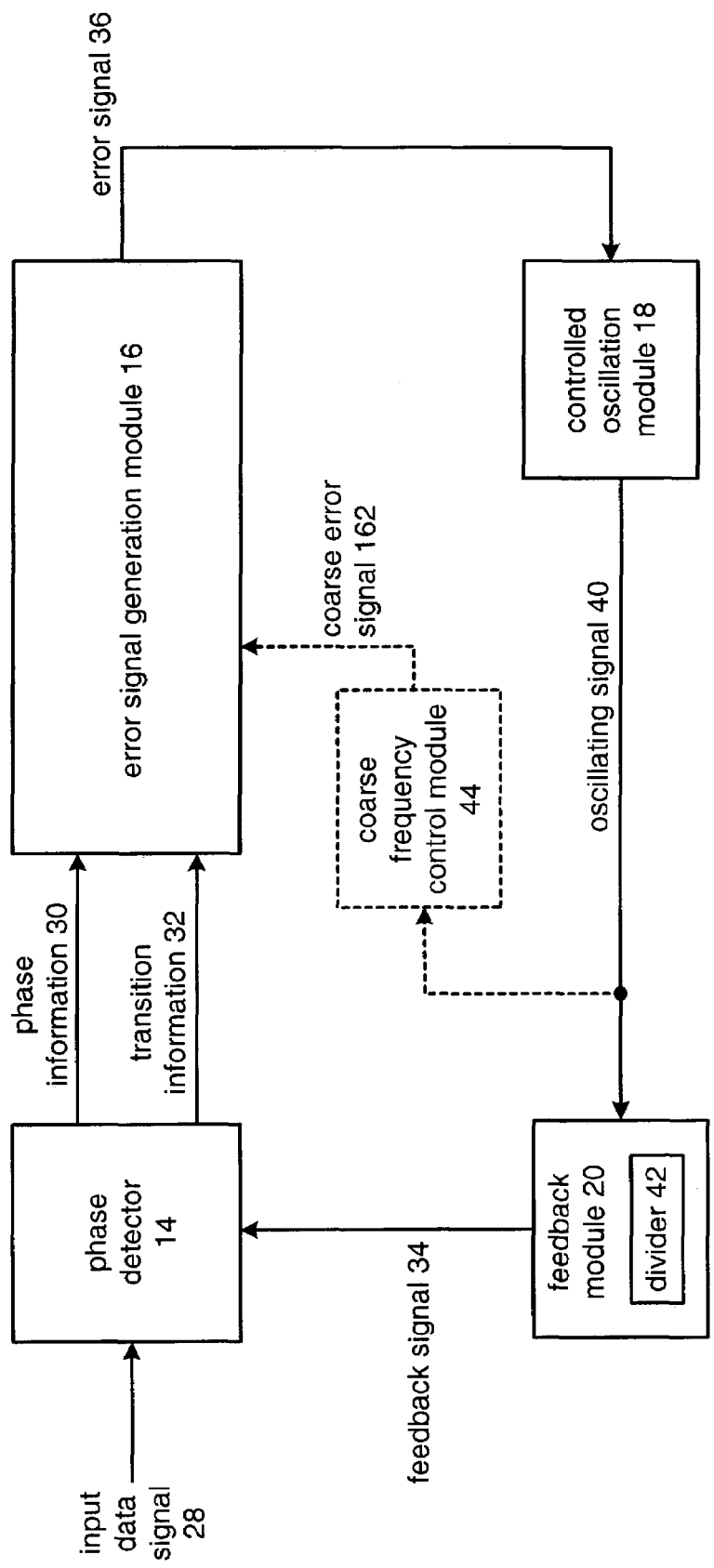
FIG. 1 illustrates a block diagram of a phase locked loop circuit in accordance with the present invention.

FIG. 1 illustrates a block diagram of a phase locked loop circuit 10 in accordance with the present invention. The phase locked loop circuit 10 includes a phase detector 14, an error signal generation module 16, a controlled oscillation module 18, and a feedback module 20. Phase locked loop circuit 10 may include a coarse frequency control module 44 (illustrated in dashed lines) coupled to quickly establish a desired frequency for controlled oscillation module 18. The operation of coarse frequency control module 44 will be discussed with reference to FIG. 5.

Phase detector 14 receives input data signal 28, which may be a high data rate bit stream (for example, 10 gigabits per second). Phase detector 14 produces phase information 30 and transition information 32 based on input data signal 28 and a feedback signal 34. Operation of phase detector 14 will be discussed in greater detail with reference to FIG. 2. Error signal generation module 16 produces an error signal 36 based on phase information 30, transition information 32, and a coarse error signal 162 for phase locked loop circuits containing the coarse frequency control module.

Controlled oscillation module 18 receives error signal 36 and produces therefrom an oscillating signal 40, which represents a recovered clock signal. Controlled oscillation module 18 may utilize inductor-capacitor oscillators to produce an output oscillation based on a D.C. signal level (in one embodiment of the invention). By utilizing inductor-capacitor oscillators in comparison to ring oscillators, the noise levels of controlled oscillation module 18 are reduced. Feedback module 20 and a divider 42 generate feedback signal 34 by dividing oscillating signal 40 by a divider value, which may be a whole number equal to or greater than one. The divider value is selected so that feedback module 20 and divider 42 adjust feedback signal 34 to one-half the data rate of input data signal 28. The error signal module comprises, in one embodiment, a charge pump and/or a transconductance circuit such as, for example, that disclosed in the priority patent application Ser. No. 10/346,435 which was filed on Jan. 17, 2003.

Figure 2:
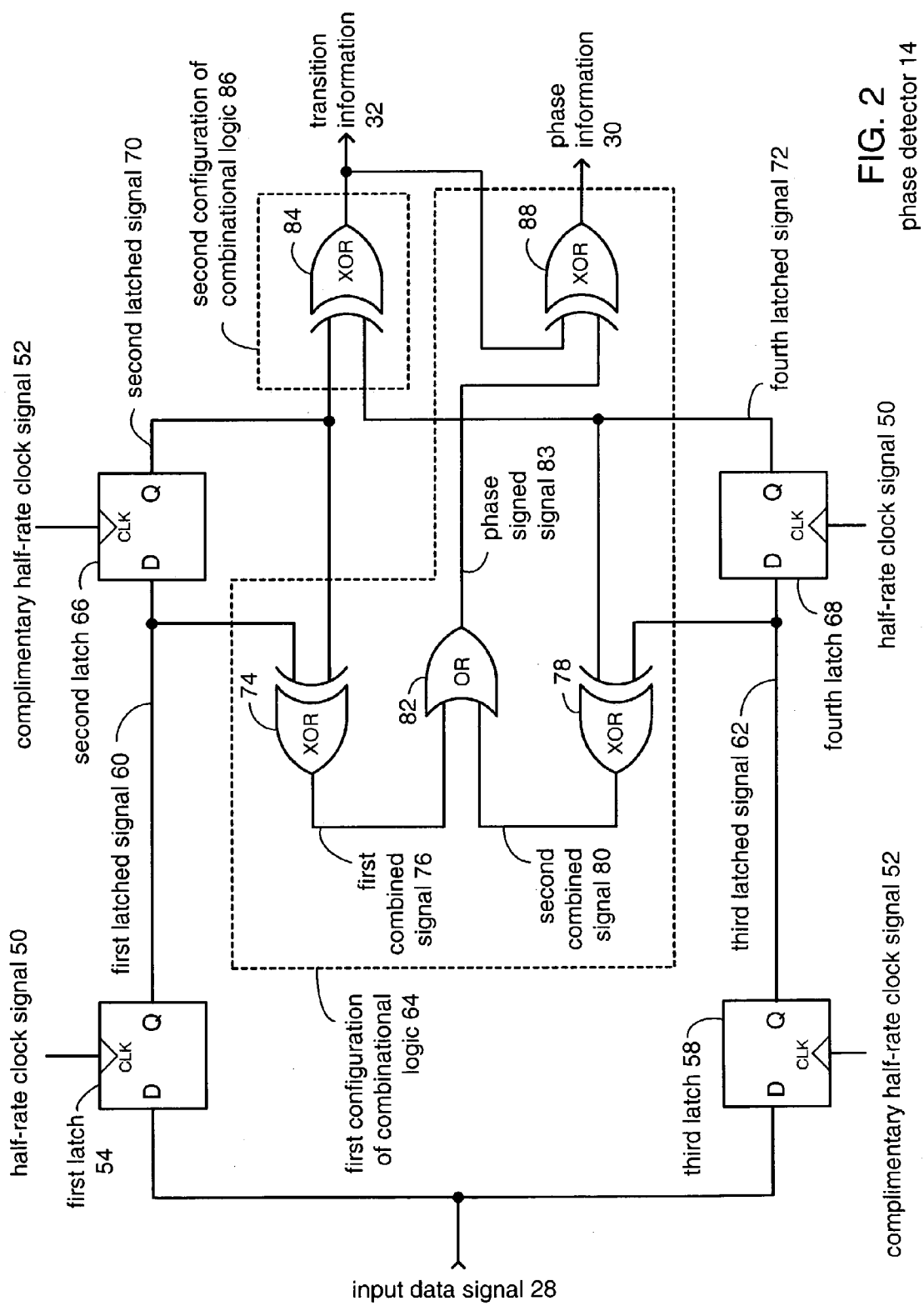
FIG. 2 illustrates a schematic block diagram of a phase detector of the phase locked loop circuit of FIG. 1.

FIG. 2 illustrates a schematic block diagram of a phase detector 14 of the phase locked loop circuit of FIG. 1. Feedback signal 34 of FIG. 1 is produced to each latch as half-rate clock signal 50 or as complimentary half-rate clock signal 52 by techniques known to those with average skill in the art. Phase detector 14 functions to produce phase information 30 and transition information 32 based on the relationship between input data signal 28 and half-rate clock signal 50 and complimentary half-rate clock signal 52. Generally, phase information 30 reflects a phase relationship of input data signal 28 with respect to half-rate clock signal 50, while transition information 32 reflects that there has been a logic level change between two successive data bits of input data signal 28. As described previously, the feedback signal is adjusted to one-half the data rate of the input data signal or to another desired fractional rate of the data based on the data recovery scheme with a fixed phase relationship between the feedback signal and the input data signal.

With the high data rates prevalent in data communications (e.g., SONET), designing a 10 or greater gigabit per second oscillator is difficult using common cost effective designs. By using a one-half data rate design and sampling on both rising and falling edges of the half-rate clock signal, an effective 10 gigabit per second rate is achieved. The data contained in input data signal 28 is essentially random, thus it is just as probable to receive a consecutive series of logic ones or logic zeros as it is to receive an alternating pattern of logic ones and logic zeros. Using phase information 30 only, the phase detector will detect the consecutive series of logic ones or logic zeros as an apparent change in input data signal frequency and will change the frequency of the controlled oscillation module. Thus, phase detector 14 produces transition information 32 to indicate a change in logic levels of input data signal 28. Transition information 32 will remain at logic one as long as input data signal 28 changes logic levels at least once every one-half clock cycle, or 100 picoseconds for the 5 gigahertz feedback signal of the present design given that the loop is locked. Transition information 32 will change to a logic zero when input data signal 28 logic level remains constant, indicating same consecutive data bits. Error signal generation module 16 of FIG. 1 uses the transition information to prevent controlled oscillation module 38 from erroneously changing frequency, on an average.

Input data signal 28 is coupled to a first latch 54 and a third latch 58 to produce a first latched signal 60 and a third latched signal 62, respectively. As is known by one of average skill in the art, latches couple data on an input terminal D to an output terminal Q as long as a CLK terminal on the latch is at logic one (for a positive edge latch, logic zero for negative edge latch). First latch 54 receives half-rate clock signal 50 at its CLK terminal, while third latch 58 receives complimentary half-rate signal 52 at its CLK terminal. Thus, first latch 54 triggers on the rising edge of half-rate clock signal 50, while third latch 58 effectively triggers on the falling edge of half-rate clock signal 50.

First latched signal 60 and third latched signal 62 are coupled to a second latch 66 and a fourth latch 68 to produce a second latched signal 70 and a fourth latched signal 72, respectively. Data on the input terminal D will only be coupled to the output terminal Q when the rising CLK signal crosses a voltage threshold (for a positive edge latch).

A first configuration of combinational logic 64 comprises a first exclusive OR (XOR) gate 74, a second XOR gate 78, an OR gate 82, and a third XOR gate 88. The inputs to first configuration of combinational logic 64 are coupled to the output terminals (Q terminals) of first latch 54, second latch 66, third latch 58, and fourth latch 68. Due to the quadrature sampling of half-rate clock signals (half-rate clock signal 50 and complimentary half-rate clock signal 52) and the first configuration of combinational logic 64, phase information 30 will be proportional to the phase difference between input data signal 28 and half-rate clock signal 50. The output thus reflects how far the edge of half-rate clock signal 50 (or complimentary half-rate clock signal 52) is from the center of a data bit in input data signal 28.

First XOR gate 74 is coupled to the output terminals (Q terminals) of first latch 54 and second latch 66 to produce a first combined signal 76. Second XOR gate 78 is coupled to the output terminals (Q terminals) of third latch 58 and fourth latch 68 produce a second combined signal 80. First combined signal 76 and second combined signal 80 are coupled to OR gate 82 to produce phase signed signal 83. Transition information 32 and phase signed signal 83 are coupled to the inputs of third XOR gate 88 to produce phase information 30. The width of phase information 30 will be one-half bit period (50 picoseconds for 10 gigabit per second data) when the half-rate clock signals are centered on the data bits.

A second configuration of combinational logic 86, comprising a fourth XOR gate 84, is coupled to receive second latched signal 70 and fourth latched signal 72 and to produce transition information 32 therefrom. Transition information 32 is indicative of a change in input data signal 28 logic levels. The phase and transition information, as described herein, will be discussed in more detail with respect to FIG. 3.

Figure 3:
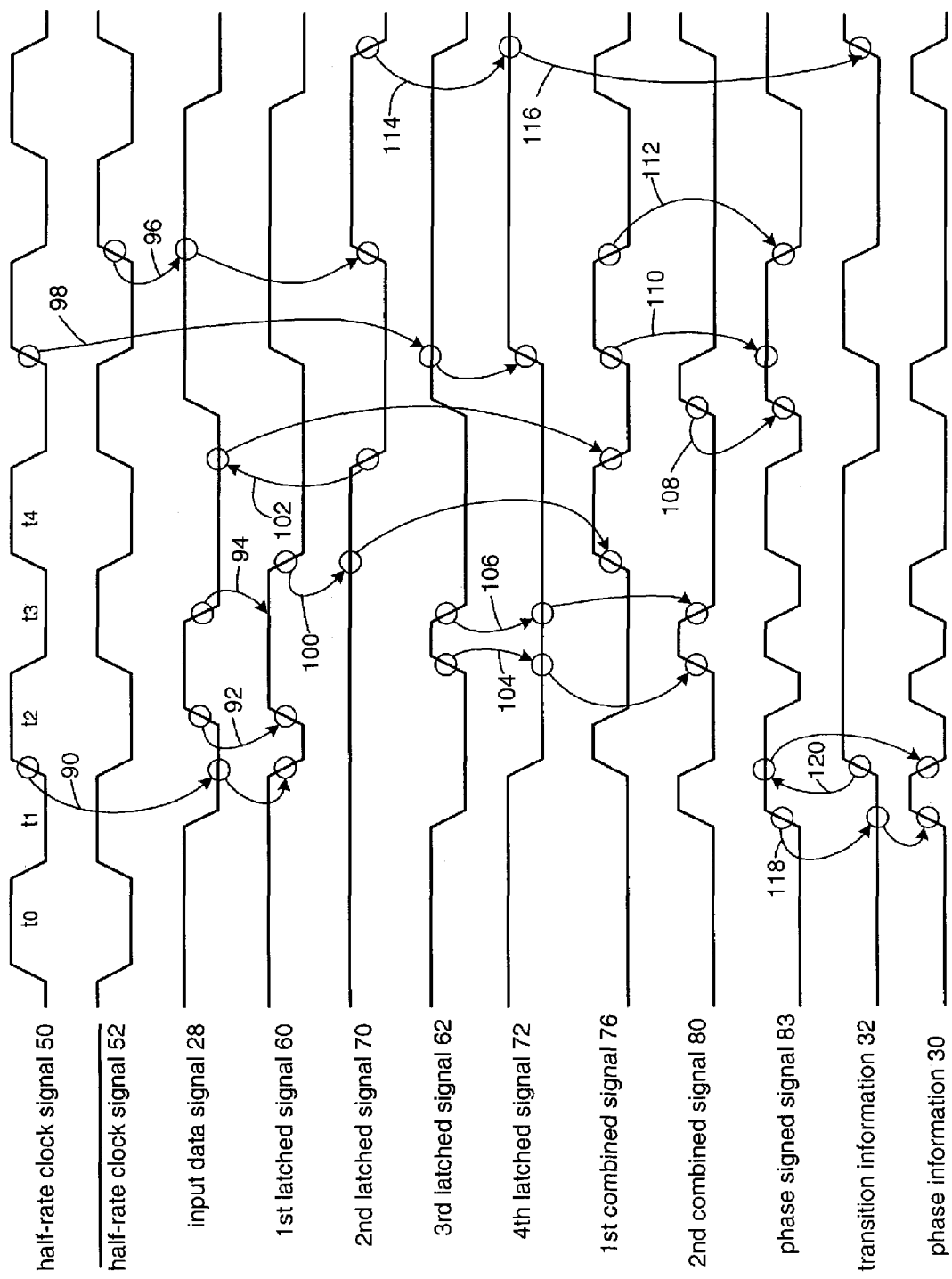
FIG. 3 illustrates timing diagrams for the phase detector of FIG. 2.

FIG. 3 illustrates timing diagrams for the phase detector of FIG. 2. The timing diagrams shown are for single-ended devices to simplify discussion, though one of average skill in the art should recognize that either single-ended or differential signaling may be used. Additionally, the timing diagrams illustrate signals with exaggerated rise time and fall time without overshoot or undershoot for exemplary purposes.

Referring now to FIG. 3, the timing diagrams illustrate phase detector 14 (of FIG. 2) locked to input data signal 28, comprising a random data bit pattern, with half-rate clock signal 50 and complimentary half-rate clock signal 52 transitioning in the center of each data bit. First latched signal 60 follows input data signal 28 during the logic one periods of half-rate clock signal 50, i.e., time periods t0, t2, t4, etc. Thus, if input data signal 28 transitions from one state to another, such as the transition during time period t2, first latched signal 60 will follow it as long as half-rate clock signal 50 is logic one. For example, at the rising edge of half-rate clock signal 50 at the start of time period t2, first latched signal 60 transitions to logic zero since input data signal 28 is logic zero. Timing line 90 indicates this sequence. When input data signal 28 transitions to logic one, first latched signal 60 also transitions to logic one as indicated by timing line 92. First latched signal 60 holds the logic one state once half-rate clock signal 50 transitions to logic zero at the end of time period t2. As shown by timing line 94, first latched signal 60 holds the logic one level when input data signal 28 transitions to logic zero.

In a similar manner, third latched signal 62 follows input data signal 28 during logic one periods of complimentary half-rate clock signal 52.

Second latched signal 70 follows first latched signal 60 during the logic one periods of complimentary half-rate clock signal 52, as shown by timing line 96. Likewise, fourth latched signal 72 follows third latched signal 62 during the logic one period of half-rate clock signal 50, as shown by timing line 98.

As was discussed previously in FIG. 2, phase information 30 is produced by an exclusive OR (XOR) function of both phase signed signal 83 and transition information 30. The XOR function will produce a logic one if either input (phase signed signal 83 or transition information 30), but not both, is a logic one. For example, timing line 100 of FIG. 3 shows first combined signal 76 transitioning to logic one coincident with first latched signal 60 transitioning to logic zero while second latched signal 70 is logic one. First combined signal 76 stays at logic one until second latched signal 70 transitions to logic zero, wherein first combined signal 76 transitions to logic zero, as shown by timing line 102. Second combined signal 80 is produced by the XOR function of third latched signal 62 and fourth latched signal 72, as shown by timing lines 104 and 106, respectively.

Timing lines 108 through 112 illustrate the generation of phase signed signal 83 from the OR function of first combined signal 76 or second combined signal 80. Phase signed signal 83 will be logic one if either first combined signal 76 or second combined signal 80 is at logic one.

Transition information 32 is produced from the XOR function of second latched signal 70 and fourth latched signal 72, as shown by timing lines 114 and 116, respectively. Transition information 32 will remain at logic one as long as a data transition is detected once each half-clock period. Each transition information 32 logic one transition is a multiple of one bit period.

As illustrated by timing lines 118 and 120, phase information 30 is produced by the XOR function of transition information 32 and phase signed signal 83. In operation, a pulse width of phase information 30 will be proportional to the phase difference between input data signal 28 and half-rate clock signal 50. The phase detector will adjust the phase of feedback signal 34 (not shown) to maintain the clock transitions in the center of input data signal 28 bit periods, thus, when locked, each phase information logic one pulse will be equal to one-half bit period.

Figure 4:
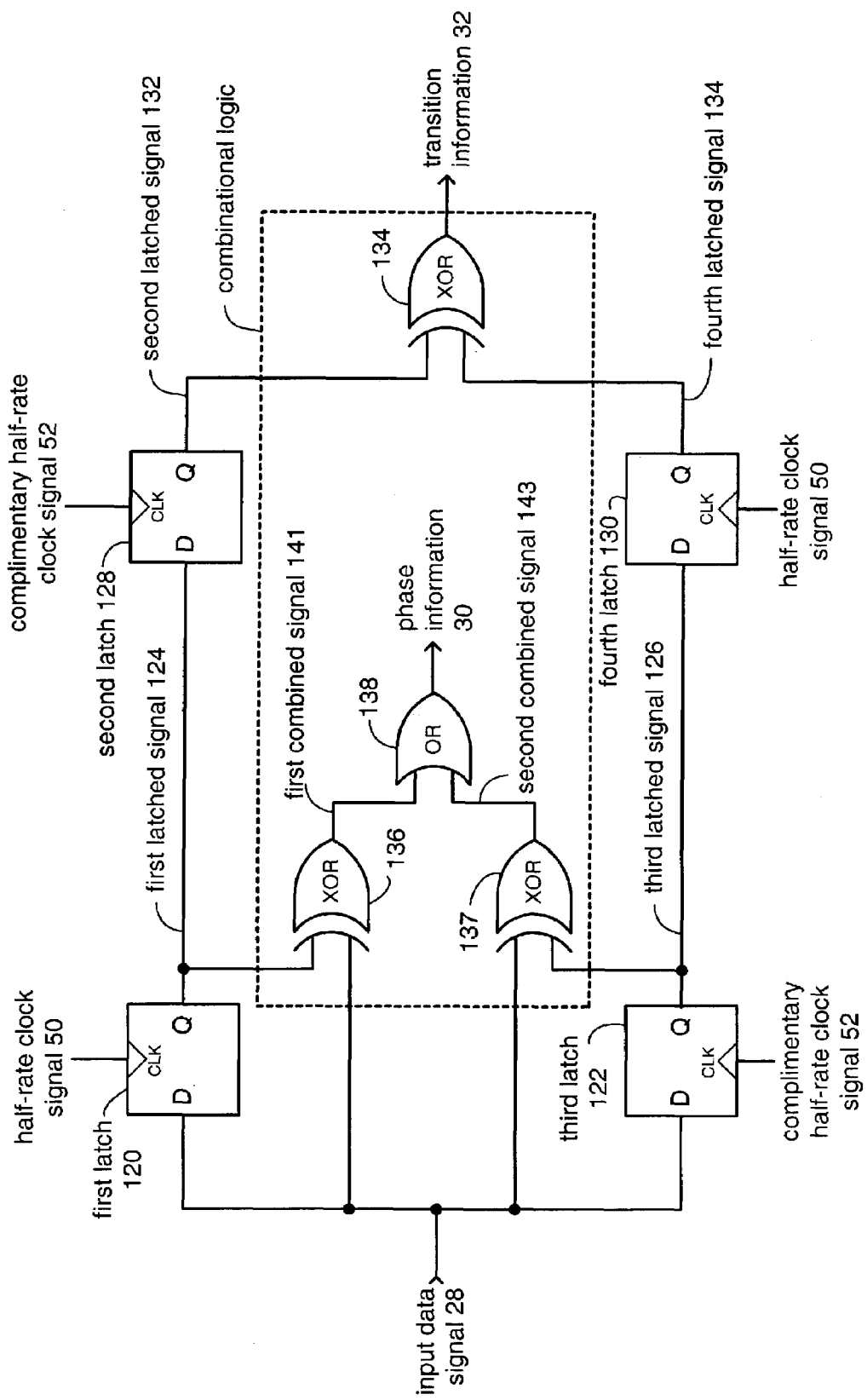
FIG. 4 illustrates a schematic block diagram of an alternate embodiment of a phase detector of the phase locked loop circuit of FIG. 1.

FIG. 4 illustrates a schematic block diagram of an alternate embodiment of a phase detector of the phase locked loop circuit of FIG. 1. The phase detector generates a one-half bit period delay between a phase signal and a transition signal. The delay is relatively timed for a middle of a first bit period and relatively timed for a beginning of a second period. Input data signal 28 is coupled to a first latch 120 and a third latch 122 to produce a first latched signal 124 and a third latched signal 126, respectively. First latch 120 receives half-rate clock signal 50 at its CLK terminal, while third latch 122 receives complimentary half-rate signal 52 at its CLK terminal. Thus, first latch 120 triggers on the rising edge of half-rate clock signal 50, while third latch 122 effectively triggers on the falling edge of half-rate clock signal 50.

First latched signal 124 and third latched signal 126 are coupled to a second latch 128 and a fourth latch 130 to produce a second latched signal 132 and a fourth latched signal 134, respectively.

The phase detector of FIG. 4 further includes combinational logic that further comprises a first exclusive OR (XOR) gate 136 that is coupled to input data signal 28 and to first latched signal 124. The combinational logic further comprises a second XOR gate 137 that is coupled to input data signal 28 and to third latched signal 126. An OR gate 138 is coupled to receive the outputs of first XOR gate 136 (first combined signal 141) and second XOR gate 137 (second combined signal 143) to produce phase information 30. Phase information 30 is proportional to the phase difference between input data signal 28 and half-rate clock signal 50. The output thus reflects how far the edge of half-rate clock signal 50 (or complimentary half-rate clock signal 52) is from the center of a data bit in input data signal 28. The width of phase information 30 will be one-half bit period (50 picoseconds for 10 gigabit per second data) when the half-rate clock signals are centered on the data bits.

A third XOR gate 134 is coupled to receive second latched signal 132 and fourth latched signal 134 and to produce transition information 32 therefrom. Transition information 32 is indicative of a change in input data signal 28 logic levels.

Figure 5:
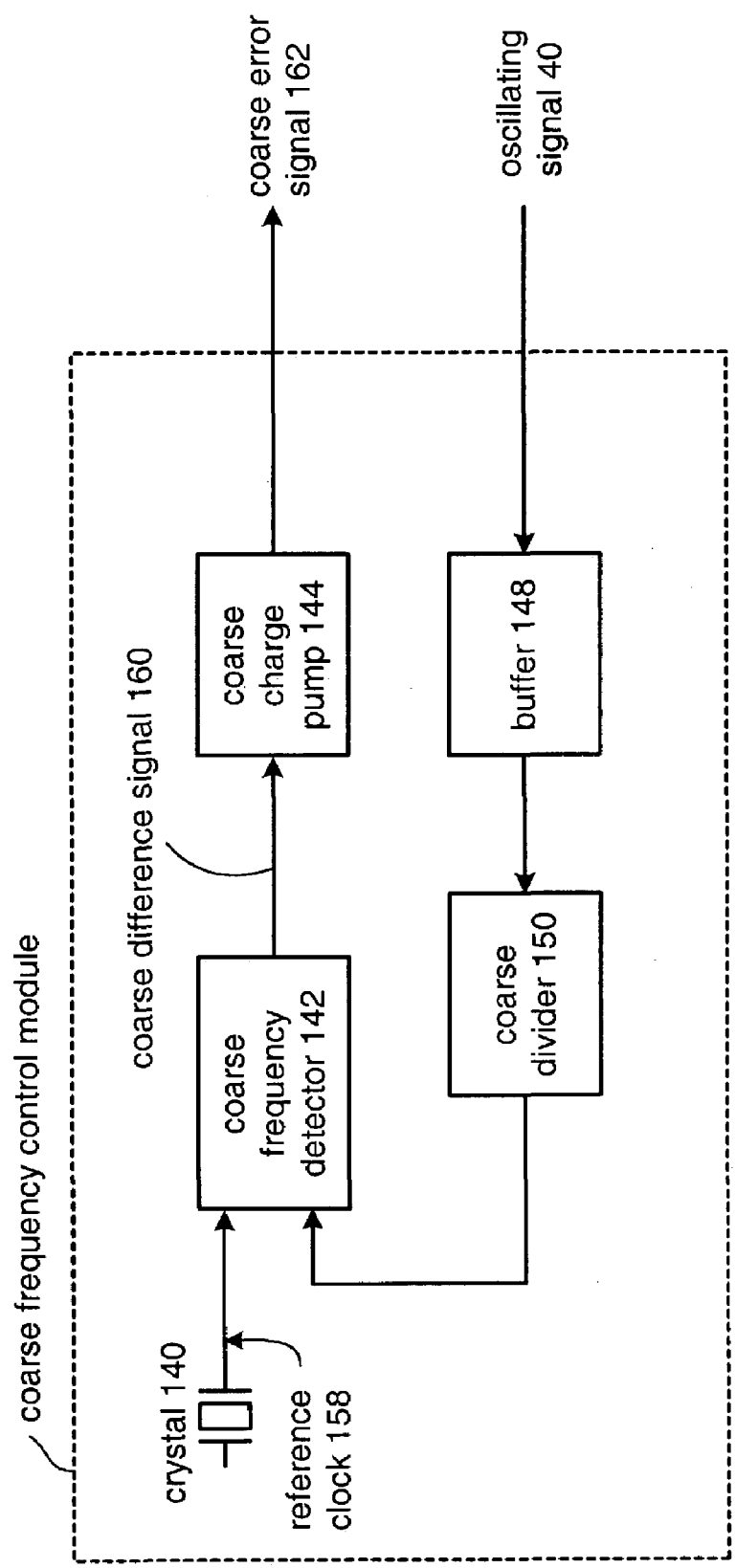
FIG. 5 illustrates a schematic block diagram of a coarse frequency control module.

FIG. 5 illustrates a schematic block diagram of coarse frequency control module 44 of FIG. 1. In operation, phase locked loop circuit 10 of FIG. 1 uses coarse frequency control module 44 to establish the desired frequency for controlled oscillation module 18, then phase detector 14 functions to adjust the phase of feedback signal 34 to align it with input data signal 28. In the present embodiment of the invention, a frequency of feedback signal 34 is one-half the data rate of input data signal 28. Coarse frequency control module 44 includes a crystal 140, a coarse frequency detector 142, a coarse charge pump 144, a buffer 148, and a coarse divider 150.

To establish the operating frequency for coarse frequency control module 44, crystal 140 produces a reference clock 158 that is provided to coarse frequency detector 142. Coarse frequency detector 142 determines the frequency difference between reference clock 158 and a divided representation of oscillating signal 40. Coarse divider 150 provides the divided representation of oscillating signal 40 to coarse frequency detector 142. Based on the frequency relationship of oscillating signal 40 and reference clock 158, coarse frequency detector 142 produces a coarse difference signal 160. Coarse charge pump 144 receives coarse difference signal 160 and produces a current representation thereof, namely, coarse error signal 162. Error signal generation module 16 (of FIG. 1) receives coarse error signal 162 and adjusts error signal 36 accordingly. Once coarse frequency control module 44 has established an operating frequency approximately equal to a desired half-rate frequency, coarse frequency control module 44 becomes inactive, wherein phase detector 14 (of FIG. 1) becomes active to adjust the phase of feedback signal 34.

Figure 6:
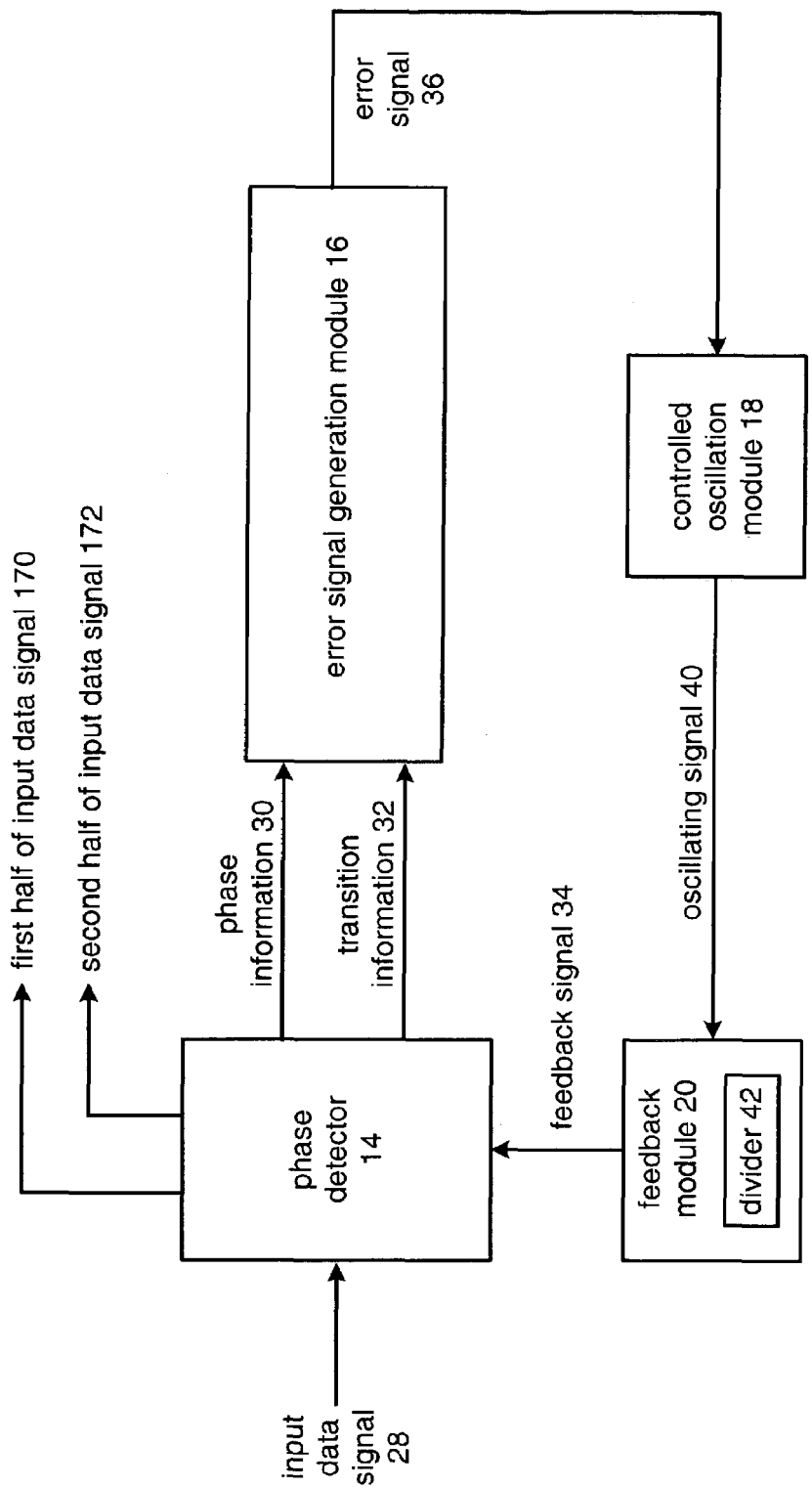
FIG. 6 illustrates a block diagram of a clock recovery circuit in accordance with one embodiment of the present invention.

FIG. 6 illustrates a block diagram of a clock recovery circuit 170 in accordance with one embodiment of the present invention. The clock recovery circuit 170 includes a phase detector 14, an error signal generation module 16, a controlled oscillation module 18, and a feedback module 20.

Phase detector 14 receives an input data signal 28, which may be a high data rate bit stream (for example, approximately 10 gigabits per second). Phase detector 14 produces phase information 30 and transition information 32 based on input data signal 28 and a feedback signal 34. Operation of phase detector 14 was discussed in FIG. 2. Error signal generation module 16 produces an error signal 36 based on phase information 30 and transition information 32. Controlled oscillation module 18 receives error signal 36 and produces therefrom an oscillating signal 40, which represents a recovered clock signal. Feedback module 20 and a divider 42 generate feedback signal 34 by dividing oscillating signal 40 by a divider value, which may be a whole number equal to or greater than one. Feedback module 20 and divider 42 divide oscillating signal 40 to approximately one-half of the input data signal data rate. Phase detector 14 further produces second latched signal 70 and fourth latched signal 72, as was discussed with reference to FIG. 2, which represent a first half of input data signal 170 and a second half of input data signal 172. Input data signal 28 can be reconstructed from first half of input data signal 170 and second half of input data signal 172 by multiplexing circuitry (not shown).

Figure 7A:
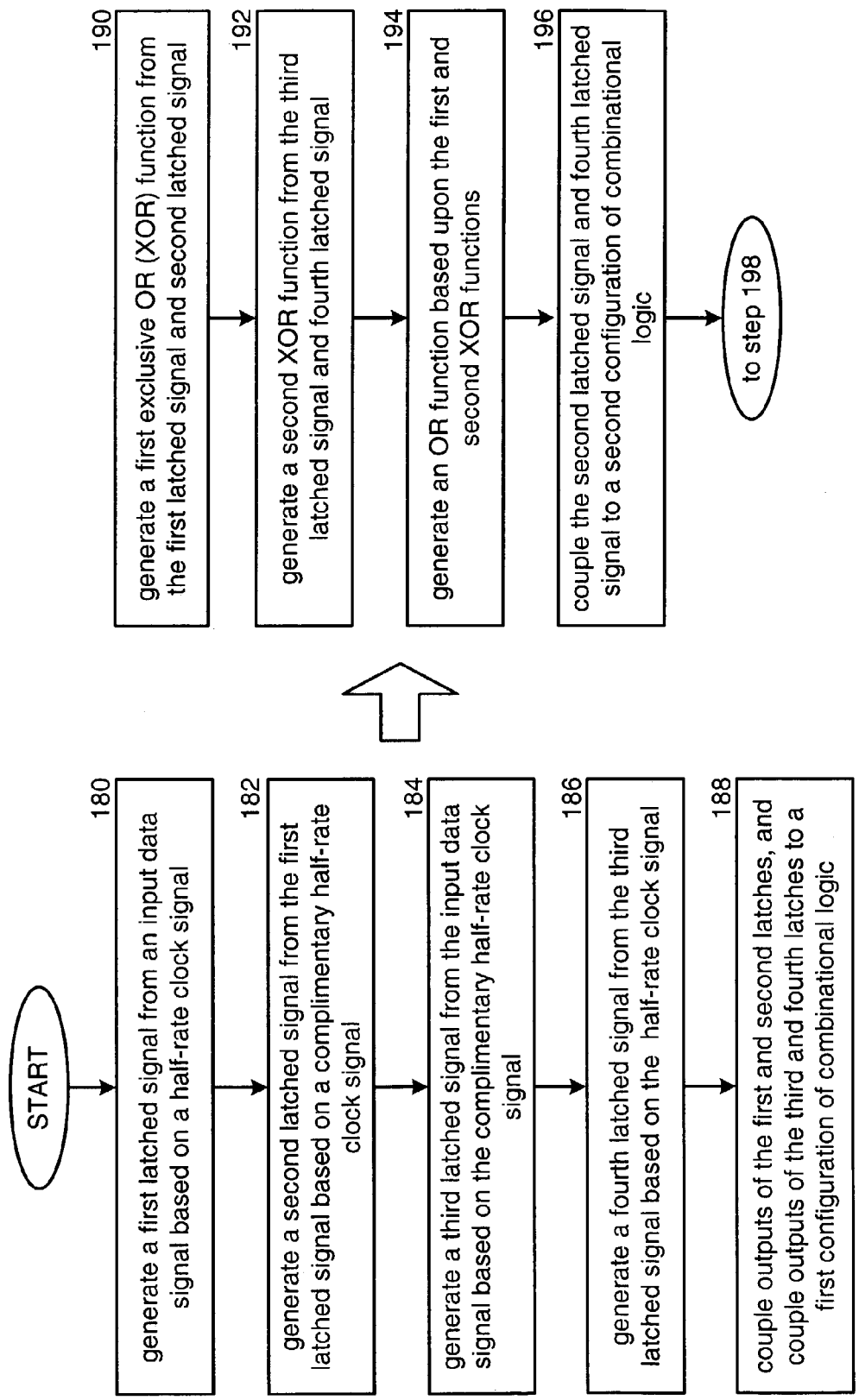
FIGS. 7a and 7b illustrate a flow chart of a phase locked loop method according to the present invention.
Figure 7B:
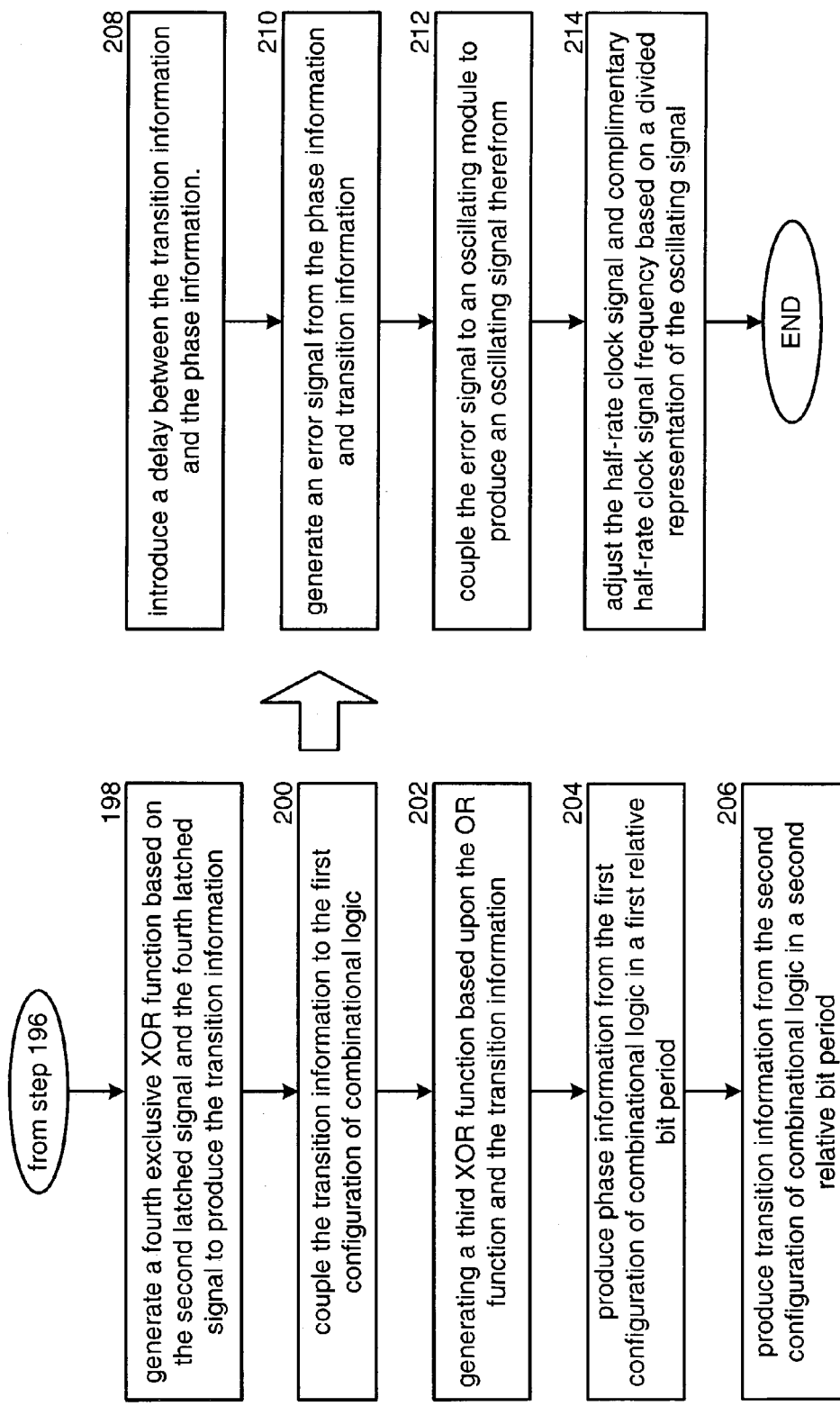

FIGS. 7a and 7b illustrate a flow chart of a phase locked loop method according to the present invention. An input data signal, comprising high speed serial data, is coupled to a first latch and a third latch, wherein the first latch is clocked by a half-rate clock signal while the third latch is clocked by a complimentary half-rate clock signal. The use of a half-rate clock architecture substantially reduces the complexity of integrated circuit design. The first latch generates a first latched signal from the input data signal based on the half-rate clock (step 180). A second latch generates a second latched signal from the first latched signal based on the complimentary half-rate clock (step 182).

Based on the complimentary half-rate clock signal, the third latch generates a third latched signal from the input data signal (step 184). A fourth latch generates a fourth latched signal from the third latched signal based on the half-rate clock signal (step 186). A first configuration of combinational logic receives outputs from the first, second, third, and fourth latches (step 188). The first configuration of combinational logic comprises a first exclusive OR (XOR) gate, a second XOR gate, an OR gate, and a third XOR gate. The first XOR function, coupled to receive the first latched signal and the second latched signal (step 190), generates a logic one if either input, but not both, is a logic one. The second XOR gate, coupled to receive the third latched signal and to receive the fourth latched signal, generates a second XOR function (step 192). The first and second XOR functions are coupled to the OR gate for generating the OR function (step 194).

The second latched signal and fourth latched signal are coupled out of the second and fourth latches, respectively, to a second configuration of combinational logic (step 196). The second configuration of combinational logic comprises a fourth XOR gate coupled to receive the second latched signal and coupled to receive the fourth latched signal to produce the transition information therefrom (step 198). The transition information is coupled to the first configuration of combinational logic (step 200).

The output of the OR function and the transition information are coupled to generate a third XOR function (step 202). Coupled out of the first configuration of combinational logic, the aforementioned functions produce the phase information in a first relative bit period (step 204). The coupling of the first configuration of combinational logic and the second configuration of combinational logic across the first, second, third, and fourth latches introduces a delay of one data period between the phase information and the transition information in one embodiment. Generally though, the transition information is produced in the second bit period relative (step 206) to the first bit period in which the phase information is introduced. The timing between the first relative bit period and the second relative bit period functions to introduce a delay between the transition information and the phase information (step 208). The delay is relatively timed from a middle of the first bit period to the beginning of the second bit period. Based on the design architecture, the delay is approximately equal to one-half bit period to one and one-half bit periods. Thus the delay is approximately a multiple of one-half bit periods. The phase information and transition information are used to generate an error signal therefrom (step 210). The error signal is coupled to an oscillating module (step 212) from which an oscillating signal is produced. The oscillating signal is coupled to a feedback module and a divider that produces a divided representation of the oscillating signal. The phase detector receives the divide representation of the oscillating and adjusts the half-rate and complimentary half-rate clock signal accordingly (step 214).

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A phase locked loop circuit comprises:
   a phase detector operably coupled to produce phase information and transition information based on a feedback signal and an input data signal, wherein the phase detector includes:
      a first latch operably coupled to latch the input data signal based on a half-rate clock signal to produce a first latched signal;
      a second latch operably coupled to latch the first latched signal based on a complimentary half-rate clock signal to produce a second latched signal;
      a third latch operably coupled to latch the input data signal based on the complimentary half-rate clock signal to produce a third latched signal;
      a fourth latch operably coupled to latch the third latched signal based on the half-rate clock signal to produce a fourth latched signal; and
      combinational logic circuitry operably coupled to the first, second, third, and fourth latches to produce the phase information and the transition information, wherein the phase information is partially based upon the transition information and is reliably timed to a middle of the first bit period and the transition information is reliably timed for a beginning of the second bit period;
   an error signal generation module operably coupled to generate an error signal based on the phase information and the transition information;
   a controlled oscillation module operably coupled to convert the error signal into an oscillating signal; and
   a feedback module operably coupled to generate the feedback signal based on the oscillating signal and a divider value.

2. The phase locked loop circuit of claim 1, wherein the phase information is produced by logic within the combinational logic circuitry that is coupled across the second and fourth latches and coupled to the transition information.

3. The phase locked loop circuit of claim 2, wherein a first configuration of combinational logic:
   couples the first latched signal and the second latched signal to a first exclusive OR gate (XOR) to produce a first combined signal;
   couples the third latched signal and the fourth latched signal to a second XOR gate to produce a second combined signal;
   couples the first combined signal and the second combined signal to an OR gate to produce a phase signed signal; and
   couples the phase signed signal and the transition information to a third XOR gate to produce the phase information.

4. The phase locked loop circuit of claim 3, wherein a second configuration of combinational logic couples the second latched signal and the fourth latched signal to a fourth XOR gate to produce the transition information.

5. The phase locked loop circuit of claim 3, wherein a delay is introduced between the phase information and the transition information.

6. The phase locked loop circuit of claim 5, wherein the delay is relatively timed from a middle of a first bit period to a beginning of a second bit period.

7. The phase locked loop circuit of claim 1, wherein the half-rate clock signal and complimentary half-rate clock signal are adjusted to an approximate center of the input data signal.

8. The phase locked loop circuit of claim 1, wherein the controlled oscillation module further comprises a coarse frequency control module coupled to lock the controlled oscillation module to an oscillating frequency substantially equal to one-half the input data signal.

9. The phase locked loop circuit of claim 1, wherein the phase information is produced by combinational logic coupled to the input data signal and to outputs of the first and third latches.

10. The phase locked loop circuit of claim 9, wherein a configuration of combinational logic:
    couples the input data signal and the first latched signal to a first exclusive OR gate (XOR) to produce a first combined signal;
    couples the input data signal and the third latched signal to a second XOR gate to produce a second combined signal; and
    couples the first combined signal and the second combined signal to an OR gate to produce the phase information.

11. The phase locked loop circuit of claim 10, wherein the configuration of combinational logic further couples the second latched signal and the fourth latched signal to a third XOR gate to produce the transition information.

12. The phase locked loop circuit of claim 10, wherein a delay is introduced between the phase information and the transition information.

13. The phase locked loop circuit of claim 12, wherein the delay is relatively timed for a middle of a first bit period and relatively timed for a beginning of a second bit period.

14. The phase locked loop circuit of claim 9, wherein the half-rate clock signal and complimentary half-rate clock signal are adjusted to an approximate center of the input data signal.

15. The phase locked loop circuit of claim 9, wherein the controlled oscillation module further comprises a coarse frequency control module coupled to lock the controlled oscillation module to an oscillating frequency substantially equal to one-half the input data signal.

16. A clock recovery circuit comprises:
    a phase detector operably coupled to produce phase information and transition information based on a feedback signal and an input data signal, wherein the phase detector includes:
       a first latch operably coupled to latch the input data signal based on a half-rate clock signal to produce a first latched signal;
       a second latch operably coupled to latch the first latched signal based on a complimentary half-rate clock signal to produce a second latched signal;
       a third latch operably coupled to latch the input data signal based on the complimentary half-rate clock signal to produce a third latched signal;

a fourth latch operably coupled to latch the third latched signal based on the half-rate clock signal to produce a fourth latched signal;

a first configuration of combinational logic operably coupled to outputs of the first latch, second latch, third latch, fourth latch, and to an output of a second configuration of combinational logic to produce the phase information; and a second configuration of combinational logic operably coupled to outputs of the second and fourth latches to produce the transition information;

an error signal generation module operably coupled to generate an error signal based on the phase information and the transition information;

a controlled oscillation module operably coupled to convert the error signal into an oscillating signal; and a feedback module operably coupled to generate the feedback signal based on the oscillating signal and a divider value.

17. The clock recovery circuit of claim 16, wherein the first configuration of combinational logic:

couples the first latched signal and the second latched signal to a first exclusive OR gate (XOR) to produce a first combined signal;

couples the third latched signal and the fourth latched signal to a second XOR gate to produce a second combined signal;

couples the first combined signal and the second combined signal to an OR gate to produce a phase signed signal; and couples the phase signed signal and the transition information to a third XOR gate to produce the phase information.

18. The clock recovery circuit of claim 16, wherein the second configuration of combinational logic couples the second latched signal and the fourth latched signal to a fourth XOR gate to produce the transition information.

19. The clock recovery circuit of claim 16, wherein a delay is introduced between the phase information and the transition information.

20. The clock recovery circuit of claim 19, wherein the delay is relatively timed from a middle of a first bit period to a beginning of a second bit period.

21. The clock recovery circuit of claim 16, wherein the half-rate clock signal and complimentary half-rate clock signal are adjusted to approximately a center of the input data signal.

22. The clock recovery circuit of claim 16, wherein the second latched signal comprises a first half of the input data signal.

23. The clock recovery circuit of claim 16, wherein the fourth latched signal comprises a second half of the input data signal.

24. A method for a phase locked loop circuit comprising:

generating a first latched signal from an input data signal based on a half-rate clock signal;

generating a second latched signal from the first latched signal based on a complimentary half-rate clock signal;

generating a third latched signal from the input data signal based on the complimentary half-rate clock signal;

generating a fourth latched signal from the third latched signal based on the half-rate clock signal;

coupling outputs of the first and second latches, and coupling outputs of the third and fourth latches to a first configuration of combinational logic;

coupling outputs of the second and fourth latches to a second configuration of combinational logic;

coupling transition information produced by the second configuration of combinational logic to the first configuration of combinational logic;

producing phase information from the first configuration of combinational logic in a first relative bit period;

producing transition information from the second configuration of combinational logic in a second relative bit period;

generating an error signal from the phase information and transition information;

coupling the error signal to an oscillating module to produce an oscillating signal there from; and adjusting the half-rate clock signal and complimentary half-rate clock signal frequency based on a divided representation of the oscillating signal.

25. The method of claim 24, wherein the first configuration of combinational logic includes:

generating a first exclusive OR (XOR) function from the first latched signal and second latched signal;

generating a second XOR function from the third latched signal and fourth latched signal;

generating an OR function based upon the first and second XOR functions; and generating a third XOR function based upon the OR function and the transition information.

26. The method of claim 24, wherein the second configuration of combinational logic includes generating a fourth exclusive XOR function based on the second latched signal and the fourth latched signal to produce the transition information.

27. The method of claim 24, wherein a delay is introduced between the transition information and the phase information.

28. The method of claim 27, wherein the delay is relatively timed for a middle of the first bit period and relatively timed for a beginning of the second bit period.

29. The method of claim 27 wherein the delay is approximately equal to one-half bit period.

30. The method of claim 27 wherein the delay is approximately equal to one and one-half bit periods.

31. The method of claim 27 wherein the delay is approximately equal to a multiple of one-half bit periods.

32. A phase detector for producing phase information and transition information based on a half-rate and a complimentary half-rate clock signal and an input data signal, wherein the phase detector includes:

latching circuitry operably coupled to latch the input data signal based on the half-rate clock signal and upon the complimentary half-rate clock signal, the latching circuitry for producing a plurality of latched signals; and combinational logic circuitry operably coupled to the latching circuitry to receive the plurality of latched signals to produce the phase information and the transition information, wherein the phase information is partially based upon the transition information and wherein the transition information is produced a multiple of one-half bit periods after the phase information and further wherein the transition information is produced at least one full bit period after the phase information.

33. The phase detector of claim 32, wherein the phase information is produced by logic within the combinational logic that is coupled to the input data signal and to outputs of first and third latches.

34. The phase detector of claim 32, wherein the transition information is produced by combinational logic coupled to receive the outputs of second and fourth latches wherein the second and fourth latches receive the outputs of the first and third latches.

35. The phase detector of claim 34 wherein the combinational logic comprises an XOR gate that exclusively ORs the outputs of second and fourth latches.

36. The phase detector of claim 32, wherein a delay that is introduced between the phase information and the transition information is relatively timed for a middle of a first bit period and relatively timed for a beginning of a second bit period, respectively.

* * * * *